United States Patent
Lee et al.

(10) Patent No.: US 7,795,086 B2
(45) Date of Patent: Sep. 14, 2010

(54) METHOD OF MANUFACTURING SEMICONDUCTOR DEVICE USING SALICIDE PROCESS

(75) Inventors: Young Jin Lee, Yongin-si (KR); Dong Sun Sheen, Yongin-si (KR); Seok Pyo Song, Seongnam-si (KR); Mi Ri Lee, Icheon-si (KR); Chi Ho Kim, Jeonju-si (KR); Gil Jae Park, Busan-si (KR); Bo Min Seo, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/346,011

(22) Filed: Dec. 30, 2008

(65) Prior Publication Data
US 2009/0186456 A1 Jul. 23, 2009

(30) Foreign Application Priority Data
Jan. 21, 2008 (KR) ........................ 10-2008-0006369

(51) Int. Cl.
*H01L 21/8238* (2006.01)

(52) U.S. Cl. .................. 438/199; 438/229; 438/230; 438/231; 257/E21.635; 257/E21.636; 257/E21.637

(58) Field of Classification Search .................. 438/199, 438/229–231; 257/E21.635, E21.636, E21.637
See application file for complete search history.

(56) References Cited

U.S. PATENT DOCUMENTS

| 5,942,787 | A * | 8/1999 | Gardner et al. | 257/408 |
|---|---|---|---|---|
| 6,165,826 | A * | 12/2000 | Chau et al. | 438/231 |
| 6,235,568 | B1 * | 5/2001 | Murthy et al. | 438/231 |
| 6,372,618 | B2 | 4/2002 | Forbes et al. | |
| 6,391,750 | B1 * | 5/2002 | Chen et al. | 438/583 |
| 6,703,672 | B1 * | 3/2004 | Brigham et al. | 257/407 |
| 6,995,434 | B2 * | 2/2006 | Usui et al. | 257/368 |
| 7,208,369 | B2 | 4/2007 | Pai et al. | |
| 7,390,750 | B1 * | 6/2008 | Ramkumar et al. | 438/706 |
| 7,465,634 | B2 * | 12/2008 | Lim et al. | 438/300 |
| 7,566,609 | B2 * | 7/2009 | Luo et al. | 438/222 |
| 2004/0043623 | A1 * | 3/2004 | Liu et al. | 438/736 |

\* cited by examiner

*Primary Examiner*—Charles D Garber
*Assistant Examiner*—Angel Roman
(74) *Attorney, Agent, or Firm*—Marshall, Gerstein & Borun LLP

(57) ABSTRACT

A method for manufacturing a semiconductor device using a salicide process, which includes forming a gate dielectric layer over a silicon substrate including a PMOS region and an NMOS region; forming a first silicon pattern in the NMOS region and a second silicon pattern in the PMOS region; forming a first metal layer that is in contact with the first silicon pattern and the exposed first portion of the silicon substrate; and forming a first gate, a first junction, a second gate, and a second junction by performing a heat treatment to silicify the respective first and second silicon patterns and the silicon substrate.

13 Claims, 6 Drawing Sheets

METHOD OF MANUFACTURING SEMICONDUCTOR DEVICE USING SALICIDE PROCESS

CROSS-REFERENCE TO RELATED APPLICATION

Priority to Korean patent application number 10-2008-0006369 filed on Jan. 21, 2008, the entire disclosure of which is incorporated by reference, is claimed.

BACKGROUND OF THE INVENTION

The invention relates to a semiconductor device and, more particularly, to a method for manufacturing a semiconductor device using a salicide process that reduces the resistance of a gate electrode.

The rapid decrease of the design rule of circuit patterns that of semiconductor devices has resulted in increases in the degree of integration of such devices. Therefore, attempts to realizing a circuit pattern having finer critical dimensions (CDs) has been made. As the CD of the circuit pattern is reduced, the resistance is expected to increase. This increase in the resistance may act as a factor that lowers an operation speed of the semiconductor device.

With the reduction of the design rule, the CD of a gate that constitutes the transistor is also reduced and the resistance of the gate itself rapidly increases. The increase in the resistance of the gate that acts as a word line may act as a factor that lowers operating speed of the transistor. Therefore, efforts to improve gate resistance have been made. Meanwhile, as the CD of the gate is reduced, a short channel effect due to reduction in the channel width results. In order to improve this short channel effect, a junction impurity region is formed more shallowly. Therefore, a surface resistance in the junction is increased and thus the operation speed is also lowered.

In order to increase the device operation speed of the transistor, development of a method capable of improving the gate resistance or the surface resistance of the junction is required.

SUMMARY OF THE INVENTION

In one embodiment, a method for manufacturing a semiconductor device using a salicide process includes forming a gate dielectric layer over a silicon substrate including a PMOS region and an NMOS region; forming a first silicon pattern in the NMOS region and a second silicon pattern in the PMOS region, over the gate dielectric layer; forming a first mask pattern that covers the PMOS region and exposes the NMOS region; doping n-type impurities into the first silicon pattern in the exposed NMOS region and a first exposed portion of the silicon substrate that is adjacent to the first silicon pattern; forming a first metal layer that is in contact with the first silicon pattern and the exposed first portion of the silicon substrate; forming a first gate and a first junction by performing a first heat treatment to silicify the first silicon pattern and the exposed first portion of the silicon substrate; forming a second mask pattern that covers the NMOS region and exposes the PMOS region; doping p-type impurities into the second silicon pattern in the exposed PMOS region and an exposed second portion of the silicon substrate that is adjacent to the second silicon pattern; forming a second metal layer that is in contact with the second silicon pattern and the exposed second portion of the silicon substrate; and forming a second gate and a second junction by performing a second heat treatment to silicify the second silicon pattern and the exposed second portion of the silicon substrate.

The gate dielectric layer is preferably formed of a material having a high dielectric constant higher than that of silicon oxide.

Forming the first and second silicon patterns preferably includes depositing a silicon layer over the gate dielectric layer; forming a partition pattern that defines side walls over the silicon layer; attaching spacers to side walls of the partition pattern; selectively removing the partition pattern; and forming the first and second silicon patterns by selectively removing the portion of the silicon layer exposed by the spacers.

The silicon layer is preferably formed by depositing a polysilicon layer.

Forming the silicon layer preferably depositing a polysilicon layer as a seed over the gate dielectric layer; and epitaxially growing silicon over the polysilicon layer.

The partition pattern is preferably formed using a silicon oxide ($SiO_2$) based material, and the spacer layer is preferably formed using a silicon nitride ($Si_3N_4$) layer or a nitride compound.

By doping the n-type impurities, the first gate has a work function different from that of the second gate which is doped with p-type impurities.

The first and second metal layers may be formed using the same metal material or metal nitride compound, preferably using cobalt (Co), nickel (Ni), a cobalt nitride compound, or a nickel nitride compound.

Alternatively, the first and second metal layers may be formed using different metal materials or metal nitride compounds. In this case, the first and second metal layer are preferably formed of different metals or metal nitride compounds selected from the group consisting of cobalt (Co), nickel (Ni), titanium (Ti), tungsten (W), copper (Cu), molybdenum (Mo), tantalum (Ta), zirconium (Zr), platinum (Pt), and nitride compounds thereof.

The first or second mask pattern is preferably formed from a silicon nitride layer or a silicon oxide layer.

DESCRIPTION OF SPECIFIC EMBODIMENTS

Hereinafter, a method for manufacturing a semiconductor device using a salicide process in accordance with the-invention is described in detail with reference to the accompanying drawings.

In a method for manufacturing a semiconductor device using a salicide process in accordance with the invention, Spacer Patterning Technology (SPT) is introduced when patterning a gate of a transistor. By forming a gate electrode using SPT, it is possible to form the gate electrode with a finer CD.

Also, in order to provide different work functions required for different kinds of gates of NMOS and PMOS, the salicide process is independently and respectively performed on a PMOS region and a NMOS region of a semiconductor device. For example, a first salicide process is performed after doping n-type impurities into the NMOS region and a second salicide process is performed after doping p-type impurities into the PMOS region. By doping different types of impurities, resultant silicide layers formed by the salicide process provide different work functions. Thus, the salicide processes that selectively silicify silicon gate electrodes implanted with different kinds of impurities are performed independently from each other. Therefore, it is possible to prevent that undesirable increases in the specific resistance of the gate electrode with a narrow CD.

Figure 1:
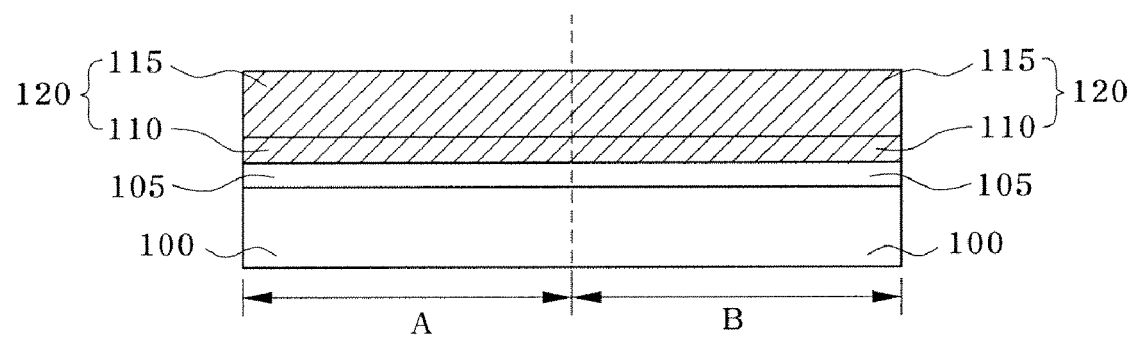
FIGS. 1 to 11 illustrate a method for manufacturing a semiconductor device using a salicide process in accordance with an embodiment of the invention.

Referring to FIG. 1, a gate dielectric layer 105 is formed over a silicon substrate 100. Herein, the silicon substrate 100 includes a first region A to be formed with an NMOS transistor and a second region B to be formed with a PMOS transistor. At this time, the gate dielectric layer 105 formed over the silicon substrate 100 is formed of a material having a high dielectric constant, preferably a material having a dielectric constant higher than that of a silicon oxide ($SiO_2$) layer. Subsequently, a silicon layer 120 is formed over the gate dielectric layer 105. Herein, the silicon layer 120 is illustratively formed by growing an episilicon layer 115 by epitaxial growth of silicon after depositing a polysilicon layer 100 as a seed. At this time, the silicon layer 120 may be deposited as a polysilicon single layer that can form a salicide electrode later.

Figure 2:
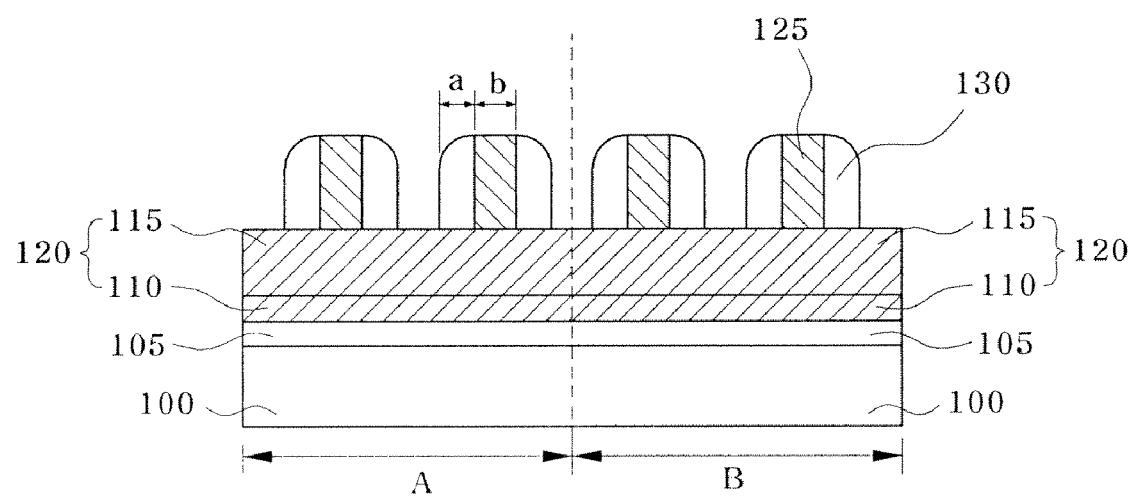

Referring to FIG. 2, a partition pattern 125 is formed over the silicon layer 120. The partition pattern 125 is spaced a predetermined distance from an adjacent partition pattern 125. Next, spacers 130 are attached to sidewalls of the partition pattern 125. Illustratively, the partition pattern 125 is formed using silicon oxide ($SiO_2$) based material, and the spacer 130 is formed using a silicon nitride (SiN) layer or nitride compound. In this case, a CD "a" of the spacer 130 and a CD "b" of the partition pattern 125 are equal. Illustratively, the CD of the spacer formed at both side faces of the partition pattern 125 is formed as same as the CD of a gate pattern to be formed. The spacer 130 formed as described above acts as a mask when etching the silicon layer 120 in an SPT process to be subsequently performed.

Figure 3:
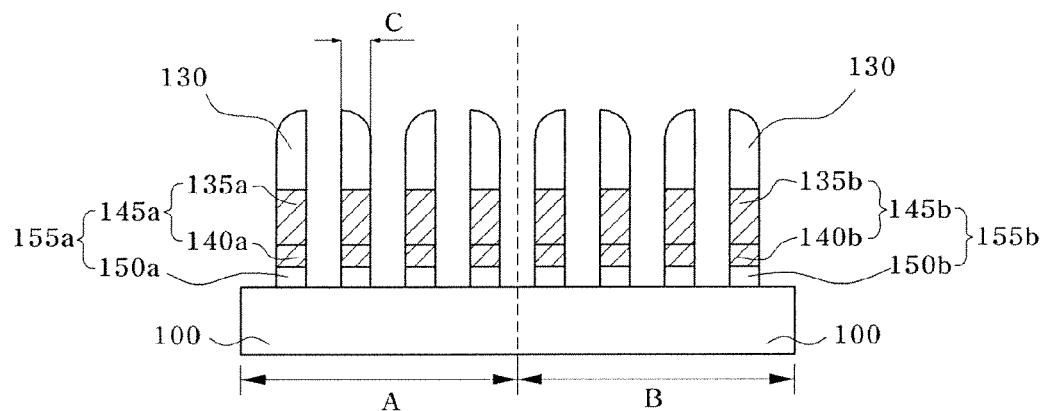

Referring to FIG. 3, a first silicon pattern 155a and a second silicon pattern 155b are formed by etching the silicon layer 120 (refer to FIG. 2) and the insulation layer 105 (refer to FIG. 2) using the spacer 130 as an etch mask. Specifically, the partition pattern 125 formed over the silicon layer 120 is removed. Illustratively, the partition pattern 125 is removed using a wet cleaning solution capable of removing silicon oxide ($SiO_2$) based material. With the removal of the partition pattern 125 by this cleaning process, the spacer 130 at both side faces of the partition pattern 125 remains. Next, the first silicon pattern 155a and the second silicon pattern 155b are formed by etching the exposed silicon layer 120 and gate dielectric layer 105 using the spacer 130 as an etch mask. And, the spacer 130 is removed. Therefore, the first silicon pattern 155a is disposed over the first region A in the silicon substrate 100 and the second silicon pattern 155b is disposed over the second region B in the silicon substrate 100. Herein, the first silicon pattern 155a includes a first gate dielectric layer pattern 150a and a first silicon layer pattern 145a. At this time, the first silicon layer pattern 145a includes a first polysilicon layer pattern 140a and a first episilicon layer pattern 135a. The second silicon pattern 155b includes a second gate dielectric layer pattern 150b and a second silicon layer pattern 145b. At this time, the second silicon layer pattern 145b includes a second polysilicon layer pattern 140b and a second episilicon layer pattern 135b. Illustratively, respective CDs "c" of the first silicon pattern 155a and the second silicon pattern 155b are the same in size as the CD "a" of the spacer 130 in FIG. 2. With this SPT process, it is possible to form a pattern having a CD finer than the lithographic limitation of a photolithography apparatus.

Figure 4:
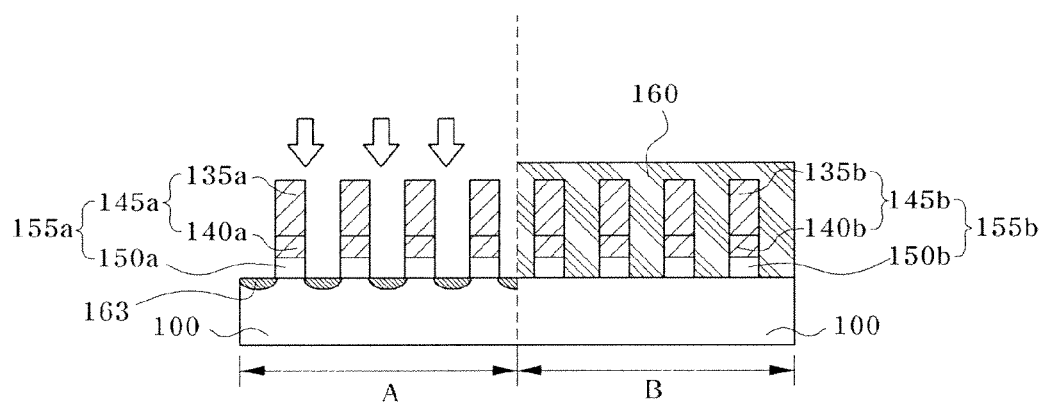

Referring to FIG. 4, a first mask pattern 160 that selectively exposes the first silicon pattern 155a is formed over the silicon substrate 100. Specifically, a mask layer is formed over the silicon substrate 100 formed with the first silicon pattern 155a and the second silicon pattern 155b. Herein, the mask layer is preferably formed including a silicon nitride layer or a silicon oxide layer. For example, the mask layer may be formed of a silicon nitride layer or a silicon oxide layer, or may be formed of a stacked layer of a silicon nitride layer and a silicon oxide layer. Next, a first mask pattern 160 is formed by performing a lithography process including an exposure process and a development process. This first mask pattern 160 selectively exposes the first silicon pattern 155a in the first region A while blocking the second region B. Next, a first ion implantation process for ion implanting first conductive type impurities onto the substrate 100 in the exposed first region A is performed as shown by arrows using the first mask pattern 160 as an ion implantation barrier layer. Herein, n-type impurities are ion implanted as the first conductive type impurities. With this first ion implantation process, the first conductive impurities, for example, n-type impurities are implanted onto the first silicon layer pattern 145a of the first silicon pattern 155a. Also, a first ion implantation layer 163 is formed as the first conductive impurities are implanted into a first portion of the silicon substrate 100.

Figure 5:
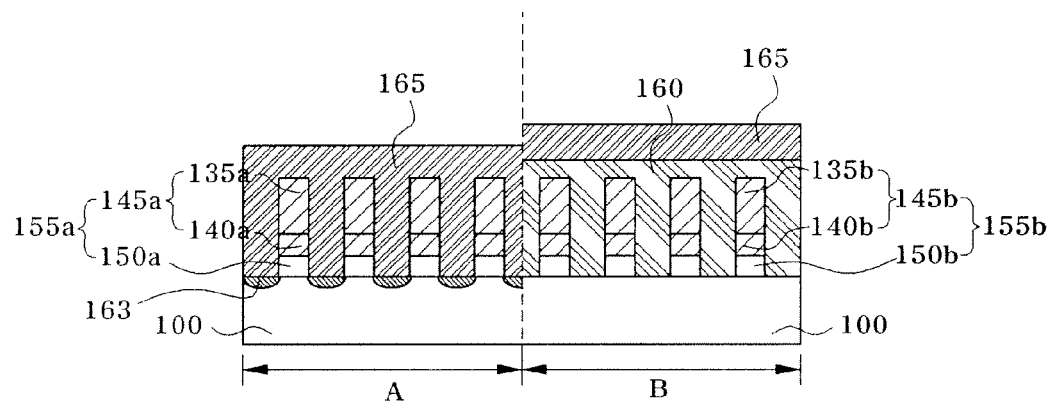

Referring to FIG. 5, a first metal layer 165 for a first salicide process is formed over the silicon substrate 100. The first metal layer 165 is in contact with the first silicon pattern 155a exposed by the first mask pattern 160 and the first ion implantation layer 163 formed in the first portion of the exposed silicon substrate 100. Herein, the first metal layer 165 is formed including a metal material or a metal nitride compound. For example, the first metal layer 165 is preferably formed of a metal selected from the group consisting of cobalt (Co), nickel (Ni), titanium (Ti), tungsten (W), copper (Cu), molybdenum (Mo), tantalum (Ta), zirconium (Zr), and platinum (Pt). Also, the first metal layer 165 may be formed from a cobalt nitride compound or nickel nitride compound, for example.

Figure 6:
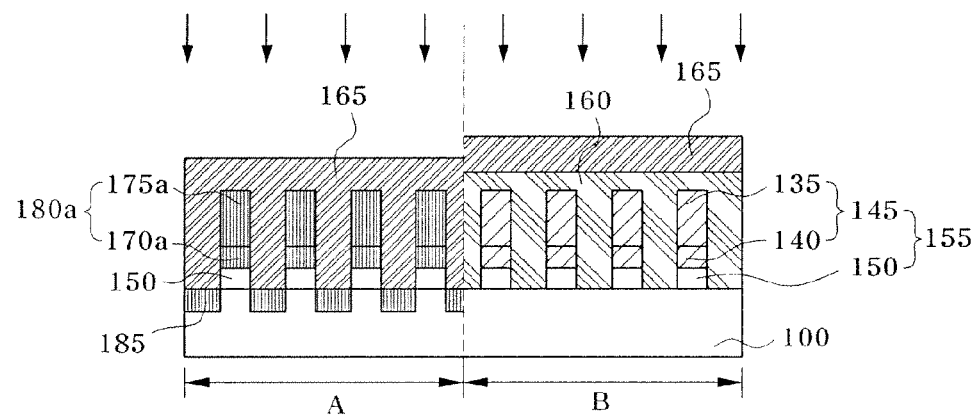

Referring to FIG. 6, a first salicide process for silicifying the first silicon layer pattern 145a of the first silicon pattern 155a is performed over the silicon substrate 100. The salicide process is performed through a procedure of forming a metal silicide layer with selection of a material of which high dielectric constant and work function are matched with each other. The first salicide process is carried out by performing a first heat treatment over the first metal layer 165 that covers the first silicon pattern 155a. The first heat treatment is performed at a temperature of 450° C. to 550° C., preferably using a rapid thermal process (RTP). The rapid thermal process (RTP) is performed 30 seconds to 1 min. When proceeding this first salicide process, silicon atoms (Si) of the first silicon layer pattern 145a (refer to FIG. 5) react with the first metal layer 165 to form a first gate 180a. Herein, the first gate 180a includes a silicified first episilicon layer pattern 175a and a silicified first polysilicon layer pattern 170a. At this time, the silicification reaction also occurs between the first ion implantation layer 163 (refer to FIG. 5) formed in the first portion of the silicon substrate 100 and the first metal layer 165. Therefore, a first junction 185 is formed in the first portion of the silicon substrate 100 in the first region A. Herein, the first junction 185 includes a first conductive type silicide layer. Herein, the second region B is blocked by the first mask pattern 160 and is thus not affected by the salicide process. Next, the first metal layer 165 which is not reacted in the salicide process is removed. The non-reacted first metal layer 165 may be removed using a mixture solution of sulfuric acid ($H_2SO_4$) and hydrogen peroxide ($H_2O_2$), for example.

Figure 7:
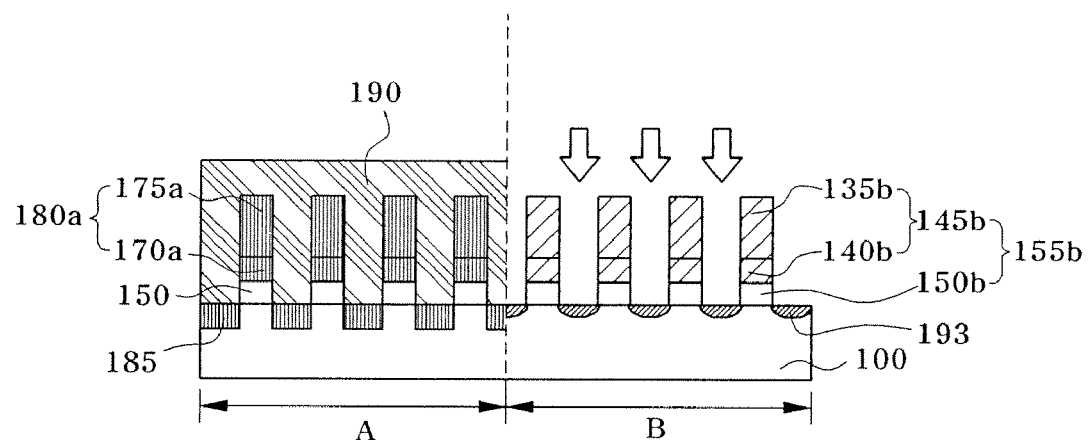

Referring to FIG. 7, a second mask pattern 190 that selectively exposes the second silicon pattern 155b is formed over the silicon substrate 100. Specifically, a mask layer is formed over the silicon substrate 100. Herein, the mask layer may be formed including a silicon nitride layer or a silicon oxide layer. For example, the mask layer may be formed of a silicon nitride layer or a silicon oxide layer, or may be formed of a stacked layer of a silicon nitride layer and a silicon oxide layer. Next, a second mask pattern 190 is formed by performing a lithography process including an exposure process and a development process. This second mask pattern 190 selectively exposes the second silicon pattern 155b in the second region B while blocking the first region A. Next, a second ion implantation process for ion implanting second conductive type impurities onto the substrate 100 in the exposed second region B is performed as shown by arrows using the second mask pattern 190 as an ion implantation barrier layer. Herein, p-type impurities are ion implanted as the second conductive type impurities. With this second ion implantation process, the second conductive impurities, for example, p-type impurities are implanted onto the second silicon layer pattern 145b of the second silicon pattern 155b. Also, a second ion implantation layer 193 is formed as the second conductive impurities are implanted into a second portion of the silicon substrate 100.

Figure 8:
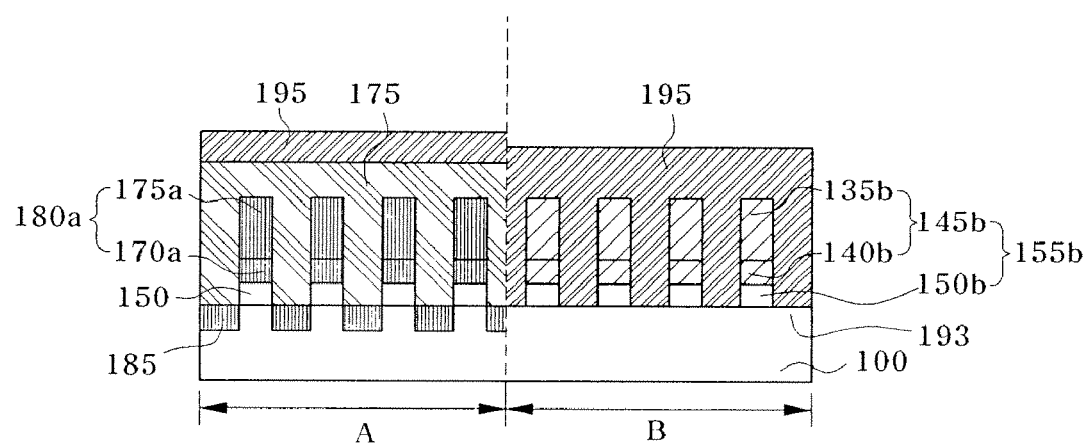

Referring to FIG. 8, a second metal layer 195 for a second salicide process is formed over the silicon substrate 100. The second metal layer 195 is in contact with the second silicon pattern 155b exposed by the second mask pattern 190 and the second ion implantation layer 193 formed in the second portion of the exposed silicon substrate 100. Herein, the second metal layer 195 is formed including a metal or a metal nitride compound used to form the first metal layer 165 (refer to FIG. 5). Herein, the second metal layer 195 is preferably formed from cobalt (Co), nickel (Ni), a cobalt nitride compound, or a nickel nitride compound. Alternatively, the second metal layer 195 may be formed from a metal material or metal nitride compound different from that of the first metal layer 165. For, example, the second metal layer 195 may be formed from a material selected from the group consisting of cobalt (Co), nickel (Ni), titanium (Ti), tungsten (W), copper (Cu), molybdenum (Mo), tantalum (Ta), zirconium (Zr), platinum (Pt), and nitride compounds thereof.

At this time, the second metal layer 195 may be deposited thinly over the second mask pattern 190 in the first region A during the deposition procedure.

Figure 9:
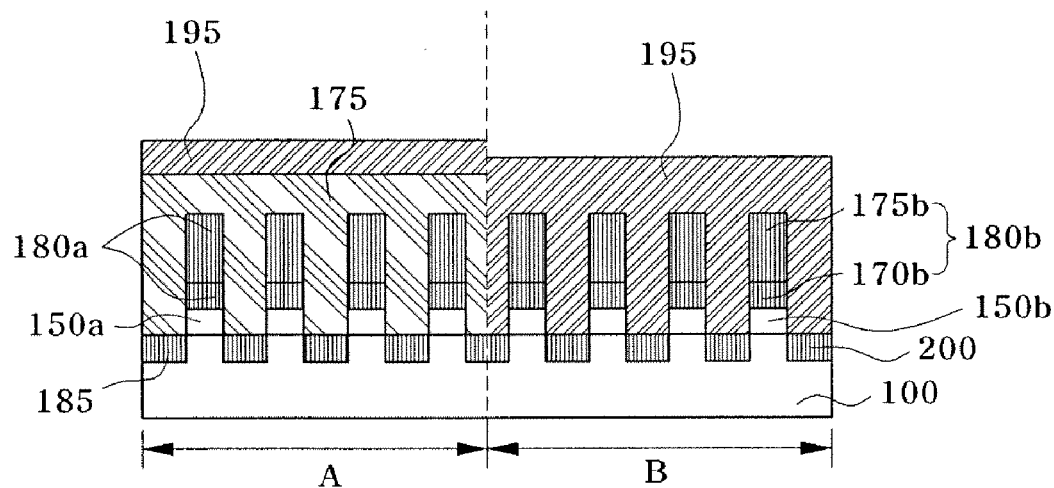

Referring to FIG. 9, a second salicide process for silicifying the second silicon layer pattern 145b of the second silicon pattern 155b is performed over the silicon substrate 100. The second salicide process is carried out by performing a second heat treatment over the second metal layer 195 that covers the second silicon pattern 155b. The second heat treatment is performed at a temperature of 700° C. to 850° C., preferably using a rapid thermal process (RTP). The rapid thermal process (RTP) is performed 15 seconds to 1 min. The second heat treatment is preferably performed same conditions with the first heat treatment when nickel (Ni) is formed as the second metal layer. When proceeding this second salicide process, silicon atoms (Si) of the second silicon layer pattern 145b (refer to FIG. 8) react with the second metal layer 195 to form a second gate 180b. Herein, the second gate 180b includes a silicified second episilicon layer pattern 175b and a silicified second polysilicon layer pattern 170b. At this time, the silicification reaction also occurs between the second ion implantation layer 193 (refer to FIG. 8) formed in the second portion of the silicon substrate 100 and the second metal layer 195. Therefore, a second junction 200 is formed in the second portion of the silicon substrate 100 in the second region B. Herein, the second junction 200 includes a first conductive type silicide layer. Herein, the first region A is blocked by the second mask pattern 190 and is thus not affected by the salicide process. Next, the second metal layer 195 which is not reacted in the salicide process is removed. The non-reacted second metal layer 195 may be removed using a mixture solution of sulfuric acid ($H_2SO_4$) and hydrogen peroxide ($H_2O_2$).

Figure 10:
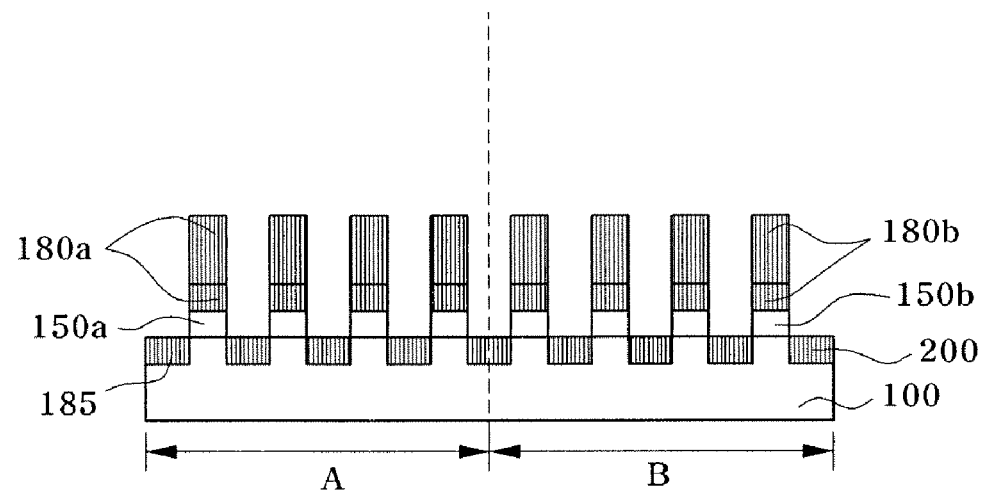

When the non-reacted second metal layer 195 is removed, as shown in FIG. 10, the first gate 180a and the first junction 185 formed by the first salicide process are disposed over the silicon substrate 100 in the first region A and the second gate 180b and the second junction 200 formed by the second salicide process are disposed over the silicon substrate 100 in the second region B. By this salicification, all the gate electrodes may be transformed wholly into the silicide, but the gate electrodes may be transformed partially into the silicide. Also, all the junction regions, into which impurities are ion implanted, may be silicified, but the junction regions may be induced to be partially silicified.

Figure 11:
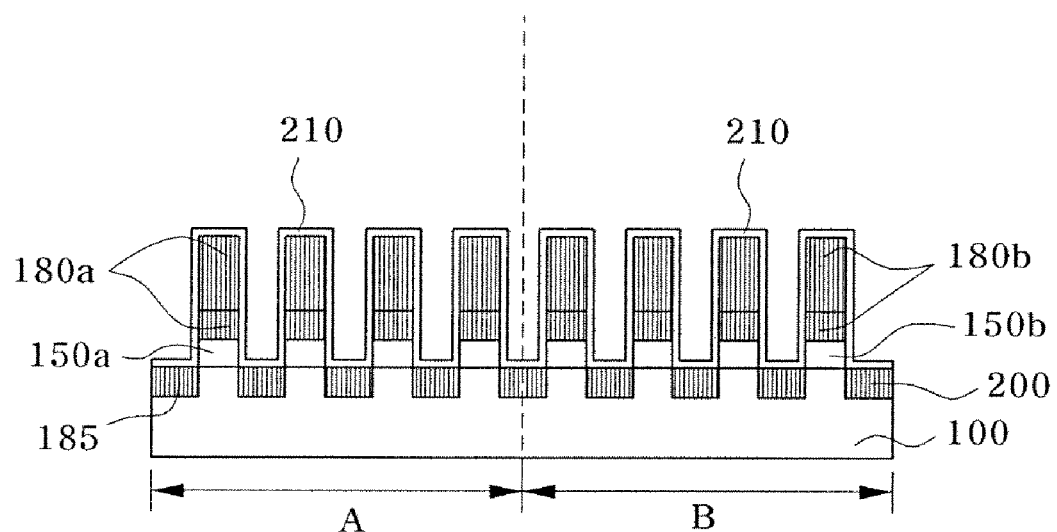

Referring to FIG. 11, a capping layer 210 is formed so as to be aligned with the first gate 180a and the second gate 180b formed over the silicon substrate 100. The capping layer 210 acts to protect the first gate 180a and the second gate 180b in a semiconductor device manufacture process to be performed later. The capping layer 210 is preferably formed of an oxide layer or a nitride layer. With the formation of this capping layer 210, a first gate stack 215a including the first gate 180a is formed in the first region A of the silicon substrate 100 and a second gate stack 215b including the second gate 180b is formed in the second region B of the silicon substrate 100.

While the invention has been described with respect to the specific embodiments, various changes and modifications may be made without departing from the spirit and scope of the invention as defined in the following claims.

What is claimed is:

1. A method for manufacturing a semiconductor device using a salicide process, comprising:

forming a gate dielectric layer over a silicon substrate, said substrate defining a PMOS region and an NMOS region;

forming a first silicon pattern in the NMOS region and a second silicon pattern in the PMOS region, over the gate dielectric layer, the first and silicon patterns each defining side walls and a top surface;

forming a first mask pattern that covers the PMOS region and exposes the NMOS region;

doping n-type impurities into the first silicon pattern in the exposed NMOS region and an exposed first portion of the silicon substrate that is adjacent to the first silicon pattern;

forming a first metal layer that covers the side walls and the top surface of the first silicon pattern and the exposed first portion of the silicon substrate;

forming a doped first gate and a first junction by performing a first heat treatment to silicify the first silicon pattern and the exposed first portion of the silicon substrate;

forming a second mask pattern that covers the NMOS region and exposes the PMOS region;

doping p-type impurities into the second silicon pattern in the exposed PMOS region and an exposed second portion of the silicon substrate that is adjacent to the second silicon pattern;

forming a second metal layer that covers the side walls and the top surface of the second silicon pattern and the exposed second portion of the silicon substrate; and forming a doped second gate and a second junction by performing a second heat treatment to completely silicify the second silicon pattern and the exposed second portion of the silicon substrate.

2. The method of claim 1, wherein the gate dielectric layer comprises a material having a high dielectric constant higher than the dielectric constant of silicon oxide.

3. The method of claim 1, comprising forming the first and second silicon patterns by:

depositing a silicon layer over the gate dielectric layer;

forming a partition pattern over the silicon layer, said partition pattern defining side walls;

attaching spacers to side walls of the partition pattern;

selectively removing the partition pattern to expose a portion of the silicon layer; and forming the first and second silicon patterns by selectively removing the portion of the silicon layer exposed by the spacers.

4. The method of claim 3, comprising forming the silicon layer by depositing a polysilicon layer.

5. The method of claim 3, comprising forming the silicon layer by:

depositing a polysilicon layer as a seed over the gate dielectric layer;

and epitaxially growing silicon over the polysilicon layer.

6. The method of claim 3, comprising forming the partition pattern using a silicon oxide (SiO2) based material, and forming the spacer layer using a silicon nitride (Si3N4) layer or a nitride compound.

7. The method of claim 1, wherein the doped first gate has a work function different from that of the doped second gate.

8. The method of claim 1, comprising forming the first and second metal layers using an identical metal material or a metal nitride compound in each case.

9. The method of claim 8, comprising forming the first and second metal layers are formed including cobalt (Co), nickel (Ni), a cobalt nitride compound or a nickel nitride compound.

10. The method of claim 1, comprising forming the first and second metal layers using a different metal material or metal nitride compound in each case.

11. The method of claim 10, comprising forming at least one of the first and second metal layers from a metal or metal nitride compound selected from the group consisting of cobalt (Co), nickel (Ni), titanium (Ti), tungsten (W), copper (Cu), molybdenum (Mo), tantalum (Ta), zirconium (Zr), platinum (Pt), and nitride compounds thereof.

12. The method of claim 1, wherein the first or second mask pattern comprises a silicon nitride layer or a silicon oxide layer.

13. A method for manufacturing a semiconductor device using a salicide process, comprising:

forming a gate dielectric layer over a silicon substrate defining a PMOS region and an NMOS region;

forming a silicon layer over the dielectric layer;

forming a partition pattern over the silicon layer, said partition pattern defining side walls;

attaching spacers to side walls of the partition patterns;

selectively removing the partition pattern to expose a portion of the silicon layer;

forming a first silicon pattern in the NMOS region and a second silicon pattern in the PMOS region by selectively removing the portion of the silicon layer exposed by the spacers, the first and silicon patterns each defining side walls and a top surface;

forming a first mask pattern that covers the PMOS region and exposes the NMOS region;

doping n-type impurities into the first silicon pattern in the exposed NMOS region and a first exposed portion of the silicon substrate that is adjacent to the first silicon pattern;

forming a first metal layer that covers the side walls and the top surface of the first silicon pattern and the exposed first portion of the silicon substrate;

forming a first gate and a first junction by performing a first heat treatment to completely silicify the first silicon pattern and the exposed first portion of the silicon substrate;

forming a second mask pattern that covers the NMOS region and exposes the PMOS region;

doping p-type impurities into the second silicon pattern in the exposed PMOS region and an exposed second portion of the silicon substrate that is adjacent to the second silicon pattern;

forming a second metal layer that covers the side walls and the top surface of the second silicon pattern and the exposed second portion of the silicon substrate; and forming a second gate and a second junction by performing a second heat treatment to completely silicify the second silicon pattern and the exposed second portion of the silicon substrate.

\* \* \* \* \*